United States Patent
Sakata et al.

(10) Patent No.: US 7,863,636 B2
(45) Date of Patent: Jan. 4, 2011

(54) SUBSTRATE FOR LIGHT-EMITTING DIODE, AND LIGHT-EMITTING DIODE

(75) Inventors: Shin-ichi Sakata, Ube (JP); Atsuyuki Mitani, Ube (JP)

(73) Assignee: Ube Industries, Ltd. (JP)

( * ) Notice: Subject to any disclaimer, the term of this patent is extended or adjusted under 35 U.S.C. 154(b) by 343 days.

(21) Appl. No.: 11/990,235

(22) PCT Filed: Aug. 2, 2006

(86) PCT No.: PCT/JP2006/315695
§ 371 (c)(1),
(2), (4) Date: Feb. 8, 2008

(87) PCT Pub. No.: WO2007/018222
PCT Pub. Date: Feb. 15, 2007

(65) Prior Publication Data
US 2009/0166667 A1    Jul. 2, 2009

(30) Foreign Application Priority Data
Aug. 10, 2005    (JP) .............................. 2005-231505

(51) Int. Cl.
*H01L 33/00* (2010.01)
*H01L 21/00* (2006.01)

(52) U.S. Cl. .............................. 257/98; 257/80; 257/89; 257/96; 257/99; 257/100; 257/103; 257/E33.023; 257/E33.067; 257/E33.068; 438/22; 438/27

(58) Field of Classification Search ................... 257/80, 257/89, 96, 98, 99, 100, 103, E33.023, E33.067, 257/E33.068; 438/22, 27
See application file for complete search history.

(56) References Cited

U.S. PATENT DOCUMENTS 5,484,752 A * 1/1996 Waku et al. .................. 501/127

(Continued)

FOREIGN PATENT DOCUMENTS

JP    7-149597 A    6/1995

(Continued)

OTHER PUBLICATIONS

Appl. Phys. vol. 34 (1995) pp. L-797-L799, Part 2, No. 7A, Nakamura et al., "High-brightness in GaN Blue, Green and Yellow Light-Emitting Diodes with Quantum Well Structures, Jul. 1995,".

(Continued)

*Primary Examiner*—Dao H Nguyen
(74) *Attorney, Agent, or Firm*—DLA Piper LLP (US)

(57) ABSTRACT

A substrate for light-emitting diodes, obtained by stacking a single crystal layer to form a light-emitting diode element onto a ceramic composite layer for light conversion, the ceramic composite layer having been formed by a unidirectional solidification method so that the ceramic composite layer comprises a solidified body having formed therein at least two or more oxide phases selected from single metal oxides and complex metal oxides to be continuously and three-dimensionally entangled with each other, with each oxide phase having a single crystal orientation, wherein at least one oxide phase out of the oxide phases in the solidified body contains a metal element oxide capable of emitting fluorescence.

19 Claims, 5 Drawing Sheets

U.S. PATENT DOCUMENTS

| | | | |
|---|---|---|---|
| 5,569,547 | A | 10/1996 | Waku et al. |
| 5,902,763 | A | 5/1999 | Waku et al. |
| 5,902,963 | A | 5/1999 | Chappaz et al. |
| 5,998,925 | A | 12/1999 | Shimizu et al. |
| 7,341,878 | B2 * | 3/2008 | Krames et al. ............... 438/22 |
| 7,514,721 | B2 * | 4/2009 | Krames et al. ............... 257/98 |
| 2008/0138919 | A1 * | 6/2008 | Mueller et al. ............... 438/27 |

FOREIGN PATENT DOCUMENTS

| | | | |
|---|---|---|---|
| JP | 7-187893 | A | 7/1995 |
| JP | 7-187893 | A | 7/1995 |
| JP | 8-81257 | A | 3/1996 |
| JP | 8-81257 | A | 3/1996 |
| JP | 8-253389 | A | 10/1996 |
| JP | 8-253389 | A | 10/1996 |
| JP | 9-67194 | A | 3/1997 |
| JP | 9-67194 | A | 3/1997 |
| JP | 10-17396 | A | 1/1998 |
| JP | 10-41546 | A | 2/1998 |
| JP | 10-163527 | A | 6/1998 |
| JP | 10-209505 | A | 8/1998 |
| JP | 8-253390 | | 5/1999 |
| JP | 2000-82845 | A | 3/2000 |
| JP | 2000-82845 | A | 3/2000 |
| JP | 2000-208815 | A | 7/2000 |
| JP | 2000-208815 | A | 7/2000 |
| JP | 2000-261034 | A | 9/2000 |
| JP | 2001-36150 | A | 2/2001 |
| JP | 2001-85747 | A | 3/2001 |
| JP | 2001-210874 | A | 8/2001 |
| JP | 2003-204080 | A | 7/2003 |

OTHER PUBLICATIONS

Hakusyoku LED Shomei System Gijutsu no OYO to Showai Tenbo (Application and Future Perspective of White LED Lighning System Technology),p. 170 (2003).

* cited by examiner

SUBSTRATE FOR LIGHT-EMITTING DIODE, AND LIGHT-EMITTING DIODE

RELATED APPLICATION

This is a §371 of International Application No. PCT/JP2006/315695, with an international filing date of Aug. 2, 2006 (WO 2007/018222 A1, published Feb. 15, 2007), which is based on Japanese Patent Application No. 2005-231505, filed Aug. 10, 2005.

TECHNICAL FIELD

The present invention relates to a substrate for light-emitting diodes usable in a display, a light, a backlight source and the like, and a light-emitting diode using the substrate for light-emitting diodes.

BACKGROUND ART

In recent years, studies have been aggressively made to develop a white light-emitting diode in which a blue light-emitting element using a nitride-based compound semiconductor is employed as a light emission source. A white light-light emitting diode is lightweight, uses no mercury and has long life, and therefore, demands are expected to rapidly expand in the future. A most commonly employed method for converting blue light of a blue light-emitting element into white light is a method where, as described, for example, in Japanese Unexamined Patent Publication (Kokai) No. 2000-208815, a coating layer containing a fluorescent material capable of absorbing a part of blue light and emitting yellow light and a mold layer for mixing blue light of the light source with yellow light from the coating layer are provided on the front surface of a blue light-emitting element, and a pseudo-white color is obtained by mixing a blue color and a yellow color which are in a complimentary color relationship with each other. As for the coating layer, a mixture of cerium-activated yttrium-aluminum-garnet (YAG:Ce) powder and epoxy resin has been conventionally employed. However, in this method, for example, uneven distribution of the fluorescent powder contained or a fluctuation in the amount of fluorescent powder among individual light-emitting diodes readily occurs when applying the coating layer, and it has been pointed out that the light-emitting diode has color unevenness attributable thereto.

In order to avoid this problem, a method has been proposed in which a light-emitting function is imparted to the substrate itself on which a blue light-emitting element is formed, and does not use powder. For example, Japanese Unexamined Patent Publication (Kokai) No. 2003-204080 proposes a method where a nitride semiconductor layer comprising $In_xAl_yGa_{1-x-y}N$ ($0 \leq x \leq 1$, $0 \leq y \leq 1$, $0 \leq x+y \leq 1$) is formed on a substrate of which main plane is a (111) face of YAG:Ce fluorescent single crystal, and blue light emitted from the semiconductor layer is made incident directly on the substrate to cause emission of homogeneous yellow fluorescence from the substrate itself, whereby a homogeneous white color free from color unevenness is obtained only by a light-emitting chip without using a fluorescent powder-containing coating layer.

As another method not using YAG fluorescent powder, Japanese Unexamined Patent Publication (Kokai) No. 2000-082845 discloses a method of obtaining a white light-emitting diode by using a ZnSe single crystal. This is a method of imparting a self-activated (SA) light-emitting function to a ZnSe substrate, forming a ZnSe-based blue light-emitting diode on the substrate, and simultaneously effecting emission of blue light and emission of yellow light from the device, thereby obtaining a white color.

However, the actual performance of the white light-emitting diode using a substrate with a YAG (111) face described in Japanese Unexamined Patent Publication (Kokai) No. 2003-204080 above is not known. The reason is because the difference between the lattice spacing of the YAG (111) substrate and the lattice spacing of $In_xGa_{1-x}N$ constituting a nitride semiconductor buffer layer formed thereon is large and a good-quality nitride semiconductor layer cannot be readily formed.

The white light-emitting diode using a ZnSe single crystal described in Japanese Unexamined Patent Publication (Kokai) No. 2000-082845 suffers from deterioration of the device and for the improvement thereof, which is needed to enhance the quality of the ZnSe substrate. In particular, reduction in the dislocation density is necessary for prolonging the life, and improvements such as optimization of the device fabricating process and change of the material are being studied at present. This is described, for example, in Tsunemasa Taguchi (supervisor), Hakusyoku LED Shomei System Gijutsu no Oyo to Showai Tenbo (Application and Future Perspective of White LED Lighting System Technology), page 170 (2003).

At the present time, a (0001) face of $Al_2O_3$ single crystal (sapphire) is widely employed as the substrate for an InGaN-based blue light-emitting diode, and its actual performance has a long history. Moreover, no problems have been reported for a device produced using the $Al_2O_3$ single crystal, along with a deterioration in a light-emitting device. Accordingly, in producing a white light-emitting diode by using light emission of the substrate itself, production is most preferably achieved by a method of fabricating a blue light-emitting element on an $Al_2O_3$ substrate. For realizing this production, as described above, light emission of the substrate itself is necessary, but a method of obtaining yellow light emission by injecting blue light to an $Al_2O_3$ single crystal has yet not reported.

An object of the present invention is to provide a substrate for light-emitting diodes, which uses no fluorescent powder, enables to form a good light-emitting diode element, less causes deterioration, transmits light of the light-emitting diode element, emits light by utilizing a part of the transmitted light, and allows the transmitted light and newly emitted light to be mixed and emitted, and a light-emitting diode using the substrate for light-emitting diodes.

SUMMARY OF THE INVENTION

As a result of intensive studies, the present inventors have found that the above-described problems can be solved by bonding and stacking a specific material layer, and accomplished the present invention.

In other words, the present invention relates to a substrate for light-emitting diodes, obtained by stacking a single crystal layer enabling to form a light-emitting diode element thereon and a ceramic composite layer for light conversion comprising a solidified body having formed therein at least two or more oxide phases selected from a single metal oxide and a complex oxide to be continuously and three-dimensionally entangled with each other, wherein at least one oxide phase in the solidified body contains a metal element oxide capable of emitting fluorescence, and also relates to a light-emitting diode using the substrate for light-emitting diodes.

In one embodiment of the substrate for light-emitting diodes of the present invention, the single crystal layer preferably comprises a material selected from the group consisting of $Al_2O_3$, SiC, ZnO and GaN.

In another embodiment of the substrate for light-emitting diodes of the present invention, the single crystal layer and the ceramic composite layer for light conversion preferably are bonded through a bonding layer comprising a substance capable of binding those two materials. Also, a fluorescent substance is preferably present in the bonding layer.

In one embodiment of the substrate for light-emitting diodes, the solidified body comprises $Al_2O_3$ and cerium-activated $Y_3Al_5O_{12}$.

When the substrate for light-emitting diodes of the present invention is used, the substrate can work as a light emission surface without using fluorescent powder, a light-emitting diode element (semiconductor layer) can be easily formed thereon, and a light-emitting diode reduced in deterioration and assured of good light mixing and less color unevenness can be obtained.

Also, by using the substrate of the present invention, in the production of an InGaN-based blue light-emitting element, an InGaN-based blue light-emitting element can be produced using a single crystal substrate such as $Al_2O_3$ having most effective performance, so that there can be obtained a white light-emitting diode where light emitted from the InGaN-based blue light-emitting element is introduced directly to the substrate, similarly to the ZnSe substrate, a part of the blue light is absorbed to emit yellow light while simultaneously transmitting the blue light, and at the same time, excitation light and fluorescence are effectively mixed by three-dimensional intertwining of a plurality of crystal phases to create uniform light. Moreover, a white light-emitting diode can be obtained only by producing a blue-light emitting element on this substrate, and the production process of a light-emitting diode can be greatly simplified. Furthermore, a substrate enabling to control the color tone can be provided by allowing another fluorescent substance to be present on the bonding surface at the time of bonding the single crystal substrate and the ceramic composite, and the substrate is also characterized in that the color tone of a light-emitting diode can be very easily controlled. The ceramic composite is given broad latitude in the light emission wavelength by this control of color tone, as a result, the compositional design of the ceramic composite material is broadened in the latitude.

The light-emitting diode of the present invention is obtained by forming a light-emitting diode element on the single crystal layer of the above-described substrate for light-emitting diodes and is characterized by taking out light from the side of the substrate for light-emitting diodes.

BEST MODE FOR CARRYING OUT THE INVENTION

The present invention is described in detail below by referring to the drawings.

Figure 1A:
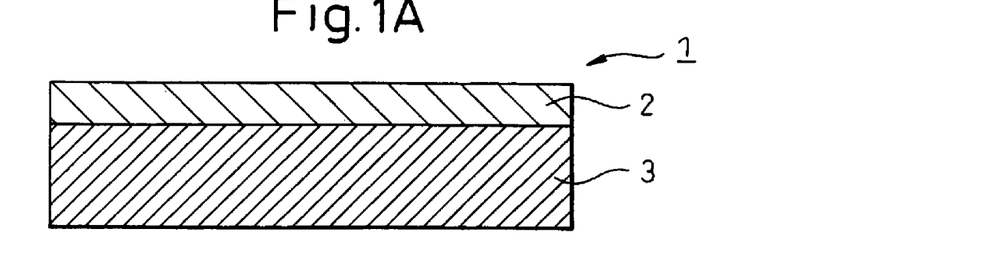
FIG. 1A is a schematic cross-sectional view showing one embodiment of the substrate for light-emitting diodes of the present invention.

The substrate of the present invention has, for example, as shown in FIG. 1A, a structure where a single crystal layer and a ceramic composite layer for light conversion are bonded and stacked. In FIG. 1, the substrate 1 for light-emitting diodes comprises a single crystal layer 2, a ceramic composite 3 and an arbitrary bonding layer 4. The single crystal layer for use in the present invention is a layer comprising a conventional single crystal on which a semiconductor such as light-emitting diode element can be formed, and examples thereof include aluminum oxide ($Al_2O_3$), silicon carbide (SiC), zinc oxide (ZnO) and gallium nitride (GaN).

The ceramic composite layer for light conversion for use in the present invention is formed of a ceramic composite material containing a fluorescent substance and comprises a solidified body formed such that metal oxides are continuously and three-dimensionally entangled with each other. The metal oxide includes a single metal oxide and a complex oxide, and the single metal oxide or complex oxide contains an element or the like capable of expressing a function, for example, fluorescence. This solidified body is a composite material formed by melting raw material metal oxides and then solidifying the melt. The single metal oxide is an oxide of one kind of a metal, and the complex oxide is an oxide of two or more kinds of metals. These metal oxides each has a structure where metal oxide phases are three-dimensionally entangled with each other. Also, another oxide phase is sometimes present between these entangled oxide phases.

Examples of the single metal oxide include aluminum oxide ($Al_2O_3$), zirconium oxide ($ZrO_2$), magnesium oxide (MgO), silicon oxide ($SiO_2$), titanium oxide ($TiO_2$), barium oxide (BaO), beryllium oxide (BeO), calcium oxide (CaO), chromium oxide ($Cr_2O_3$) and rare earth element oxides ($La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$). Examples of the complex oxide include $LaAlO_3$, $CeAlO_3$, $PrAlO_3$, $NdAlO_3$, $SmAlO_3$, $EuAlO_3$, $GdAlO_3$, $DyAlO_3$, $ErAlO_3$, $Yb_4Al_2O_9$, $Y_3Al_5O_{12}$, $Er_3Al_5O_{12}$, $Tb_3Al_5O_{12}$, $11Al_2O_3.La_2O_3$, $11Al_2O_3.Nd_2O_3$, $3Dy_2O_3.5Al_2O_3$, $2Dy_2O_3.Al_2O_3$, $11Al_2O_3.Pr_2O_3$, $EuAl_{11}O_{18}$, $2Gd_2O_3.Al_2O_3$, $11Al_2O_3.Sm_2O_3$, $Yb_3Al_5O_{12}$, $CeAl_{11}O_{18}$ and $Er_4Al_2O_9$.

As for the method of bonding a plate working out to a single crystal layer and a plate working out to a ceramic composite layer for light conversion, for example, a method of directly bonding these plates at a high temperature may be used. This method is the simplest and a most ideal method in that a hetero-phase is not allowed to be present on the interface. In the case of using an aluminum substrate as the plate working out to the single crystal layer, the bonding needs to be performed at a temperature of approximately from 1,700 to 1,800° C. for a time of approximately from 1 to 50 hours. If the bonding temperature exceeds this range, deformation occurs in the single crystal plate and ceramic composite plate, whereas if the temperature is less than the range, the bonding does not proceed. However, the $Al_2O_3$ single crystal layer and the ceramic composite layer need to be exposed to a high temperature for a long time and this is disadvantageous in view of cost.

In order to solve this problem, there is a method of allowing a very small amount of a low-melting-point material (e.g., silica) to intervene as a bonding layer on the bonding surface between the single crystal layer and the ceramic composite layer. By this method, bonding can be performed at a lower temperature to favor reduction of the bonding temperature and time, which is advantageous in view of cost. In the case of allowing a low-melting-point compound such as glass to intervene, the composition of glass must be determined by taking into consideration the temperature and atmosphere in view of processing of the InGaN-based diode. In the case of a typical Pyrex (registered trademark) glass, a temperature of approximately from 900 to 1,300° C. and a time of approximately from 1 to 10 hours are necessary. Bonding pressure is not necessarily required, but since higher adhesion is attained by applying a pressure, a pressure of, for example, from 0.01 to 100 MPa is preferably applied using a hot-press device or the like.

Furthermore, in one embodiment of the substrate for light-emitting diodes of the present invention, the single crystal layer and the ceramic composite layer for light conversion are bonded through a bonding layer comprising a substance capable of bonding those two layers. When a resin is used as the bonding layer for bonding the layers at a lower temperature, bonding (adhesion) can be performed at a lower temperature. In this case, every fluorescent substance can be allowed to be present in the bonding layer. By virtue of the fluorescent substance, the color tone of the light-emitting diode can be controlled. As for the fluorescent substance allowed to be present in the bonding portion, various fluorescent materials may be used but considering application to a white light-emitting diode, a material of emitting red fluorescence, such as europium-activated $Ca_2Si_5N_8$ and europium-activated $CaAlSiN_3$, is preferred. As for the adhesive material, an epoxy resin, a silicon resin or the like may be used.

When an $Al_2O_3$ single crystal is used as the single crystal layer and an InGaN-based blue light-emitting element is formed thereon, the light emitted from the blue light-emitting element enters the $Al_2O_3$ single crystal layer and further enters the ceramic composite layer for light conversion. A part of the blue light is transmitted as it is, and a part of the blue light is absorbed by the ceramic composite layer for light conversion, as a result, for example, yellow light is newly emitted. In the ceramic composite layer for light conversion, a plurality of crystal phases are three-dimensionally entangled and by virtue of this intertwining, blue light and yellow light are effectively mixed and then emitted.

Figure 1B:
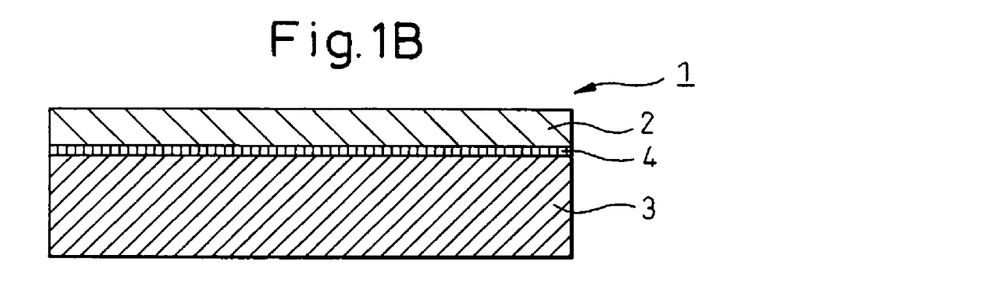
FIG. 1B is a schematic cross-sectional view showing another embodiment of the substrate for light-emitting diodes of the present invention.

A bonding layer as shown in FIG. 1B can also be allowed to intervene. The bonding layer not only contributes to reduction in the temperature when bonding the single crystal layer and the ceramic composite layer for light conversion and simplification of the process but also can be imparted with a new function. Examples of the function include a function of controlling the color tone by the addition of a new fluorescent substance. In this case, new light (for example, red) can be added to the above-described mixing of blue light and yellow light, and the color tone can be controlled.

As for the single crystal layer of a blue light-emitting element, a method of using SiC, ZnO or GaN is also known other than $Al_2O_3$. In this case, a plate of SiC, ZnO or GaN and the ceramic composite for light conversion are bonded, whereby the same function can be exerted.

The substrate material for a light-emitting diode element is described below, but various applications may be considered for this substrate according to the combination of elements of the materials constituting the single crystal layer and the ceramic composite layer, and the present invention is not limited to these examples.

The plate working out to the $Al_2O_3$ single crystal layer for use in the present invention is produced from a melt by a CZ method, a EFG method or the like, but such a plate is widely available on the market and a commercially available product may be utilized.

For producing an InGaN-based blue light-emitting element, a plate working out to an $Al_2O_3$ single crystal layer and a plate working out to a ceramic composite layer for light conversion are preferably bonded. Therefore, the ceramic composite layer for light conversion also preferably contains an $Al_2O_3$ crystal. When an $Al_2O_3$-containing ceramic composite for light conversion is used, the difference in the refractive index on the bonding surface with the $Al_2O_3$ single crystal layer becomes very small, and light can be effective transmitted therethrough. Particularly, in the case of using $Al_2O_3$ (0001) for the substrate surface, the $Al_2O_3$ phase in the ceramic composite for light conversion is preferably bonded at the (0001) face. Because, by this bonding, the bonding portion of the $Al_2O_3$ layer is freed from difference in the refractive index due to crystal orientation and light can be transmitted therethrough most efficiently.

The crystal phase present together with the $Al_2O_3$ crystal in the ceramic composite layer for light conversion is preferably an $A_3X_5O_{12}$-type crystal which is a complex oxide activated with at least cerium. It is preferred that A in the structural formula contains one or more elements selected from the group consisting of Y, Tb, Sm, Gd, La and Er and X in the structural formula contains one or more elements selected from Al and Ga. A ceramic composite for light conversion comprising this preferred combination absorbs a part of violet-to-blue light while transmitting the light and emits yellow fluorescence. Above all, a combination of cerium-activated $Y_3Al_5O_{12}$ and $Al_2O_3$ crystal is preferred because strong fluorescence is emitted.

A very important characteristic feature of the ceramic composite for light conversion is that each crystal phase is not independent and respective phases are integrated in an indivisible relationship. In the case of the above-described ceramic composite for light conversion comprising $Al_2O_3$ crystal and $Y_3Al_5O_{12}$:Ce, two crystals are not merely present but two crystals are present as a result of simultaneous crystallization of an $Al_2O_3$ crystal and a $Y_3Al_5O_{12}$:Ce crystal from one kind of a melt having a composition which is neither $Al_2O_3$ nor $Y_3Al_5O_{12}$, and this differs from the case where two crystals are independently present. In this meaning, two crystals are indivisible. Such a solidified body is virtually different from the state of an $Al_2O_3$ crystal and a YAG:Ce crystal being merely mixing and therefore, this ceramic composite shows a unique fluorescence behavior.

The solidified body constituting the ceramic composite layer for light conversion is produced by melting raw material metal oxides and then solidifying the melt. The solidified body may be obtained, for example, by a simple method of charging the melt into a crucible kept at a predetermined temperature and then cooling it while controlling the cooling temperature, but a solidified body produced by a unidirectional solidification method is most preferred. Because, when unidirectional solidification is performed, the crystal phase contained continuously grows in a single crystal state or a state similar thereto and each phase comes to a single crystal orientation.

The ceramic composite for light conversion for use in the present invention may be the same as the ceramic composite material disclosed, for example, in Japanese Unexamined Patent Publication (Kokai) Nos. 7-149597, 7-187893, 8-81257, 8-253389, 8-253390 and 9-67194 previously filed by the applicant of the present invention and their corresponding U.S. applications (U.S. Pat. Nos. 5,569,547, 5,484,752 and 5,902,963) except that at least one phase contains a metal element oxide capable of emitting fluorescence, and can be produced by the production method disclosed in these patent publications.

The nitride semiconductor layer, which is one example of the semiconductor layer formed on the substrate of the present invention, comprises a plurality of nitride-based compound semiconductor layers. The plurality of nitride-based compound semiconductor layers each is preferably composed of a nitride-based compound represented by the formula: $In_xAl_yGa_{1-x-y}N$ (wherein $0 \leq x \leq 1$, $0 \leq y \leq 1$ and $0 \leq x+y \leq 1$). The nitride semiconductor layer has at least a light-emitting layer capable of emitting visible light. In order to form a good light-emitting layer, a plurality of nitride-based compound semiconductor layers where the composition of each layer is adjusted to be optimal for each function are preferably stacked.

The plurality of nitride-based compound semiconductor layers and the method for forming these layers are known techniques as disclosed, for example, in *Jpn. J. Appl. Phys.*, Vol. 34, L798 (1995). Specifically, a GaN buffer layer, an n-type GaN:Si contact layer on which an n-electrode is formed, an n-type $Al_{0.5}Ga_{0.9}N$:Si layer, an n-type $In_{0.05}Ga_{0.95}N$:Si layer, an InGaN layer which forms a single quantum well structure-type light-emitting layer, a p-type $Al_{0.1}Ga_{0.9}N$:Mg barrier layer, and a p-type GaN:Mg layer on which a p-electrode is formed, are sequentially stacked on a substrate by MOCVD or the like, whereby the plurality of nitride-based compound semiconductor layers can be obtained. The structure of the light-emitting layer may be a multiple quantum well structure other than the single quantum well structure or may be a homo-structure, a hetero-structure or a double hetero-structure. Thus thus-produced light-emitting diode element can be used as a white light-emitting diode only by placing it in a package shown in FIG. 2 and connecting electrodes thereto.

Figure 2:
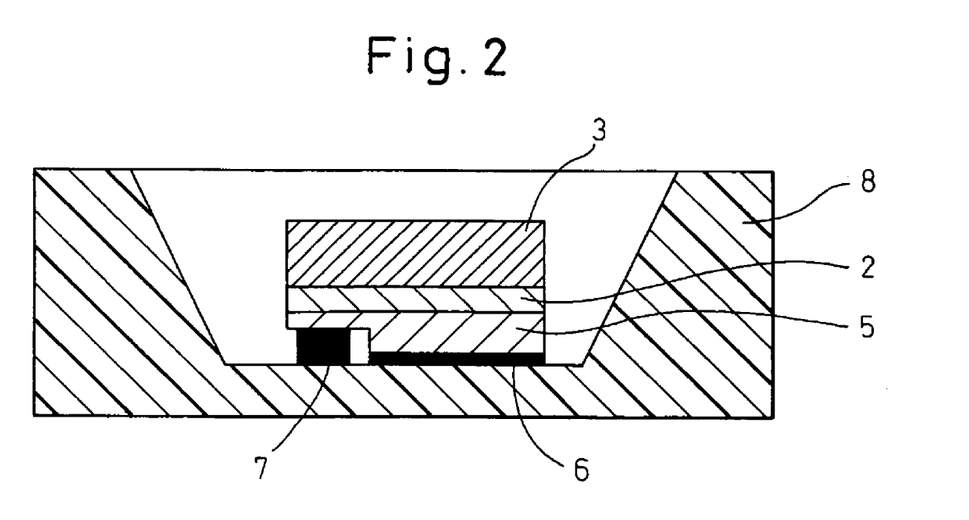
FIG. 2 is a schematic view showing one embodiment of the light-emitting diode using the substrate of the present invention.

In FIG. 2, reference numeral 1 is a substrate for light-emitting diodes, 2 is a single crystal layer, 3 is a ceramic composite, 5 is a light-emitting element (diode element), 6 and 7 are electrodes, and 8 is a package.

EXAMPLES

The present invention is described in greater detail below by referring to specific examples.

Example 1

An $\alpha$-$Al_2O_3$ powder (purity: 99.99%) and a $Y_2O_3$ powder (purity: 99.999%) were weighed to give a molar ratio of 82:18 and a $CeO_2$ powder (purity: 99.99%) was weighed to amount of 0.03 mol per mol of $Y_3Al_5O_{12}$ produced by the reaction of oxides charged. These powders were wet-mixed in ethanol by a ball mill for 16 hours, and then the solvent ethanol was removed by using an evaporator to obtain a raw material powder. This raw material powder was preliminarily melted in a vacuum furnace and used as a raw material for unidirectional solidification.

The obtained raw material was directly charged into a molybdenum crucible and after setting the crucible in a uni-directional solidification apparatus, the raw material was melted under a pressure of $1.33 \times 10^{-3}$ Pa ($10^{-5}$ Torr). In the same atmosphere, the crucible was moved down at a speed of 5 mm/hour, whereby a solidified body comprising a garnet crystal $Y_3Al_5O_{12}$:Ce and an $\alpha$-type aluminum oxide crystal $Al_2O_3$ was obtained. This solidified body took on a yellow color.

Figure 3:
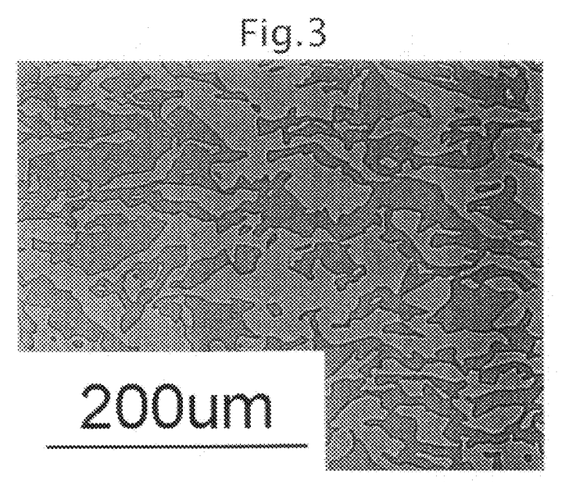
FIG. 3 is a cross-sectional view showing the texture of the ceramic composite for light conversion according to the present invention obtained in Example 1.

FIG. 3 shows a cross-sectional texture parallel to the solidification direction of the solidified body. The white portion is the $Y_3Al_5O_{12}$:Ce crystal and the black portion is the $Al_2O_3$ crystal, and the solidified body has a texture such that two crystals are entangled with each other.

From the ceramic composite material, a 1 mm-thick substrate of 10 mm×10 mm was cut out by a diamond cutter and finished to a thickness of 0.6 mm by a grinding machine, and one surface was polished to a mirror surface. The average surface roughness thereof was measured and found to be 0.014 microns. On the other hand, a commercially available (0001) face substrate was used for the $Al_2O_3$ single crystal. The size was 10 mm×10 mm, the thickness was 0.5 mm, and the surface roughness was 1 nm.

Figure 4:
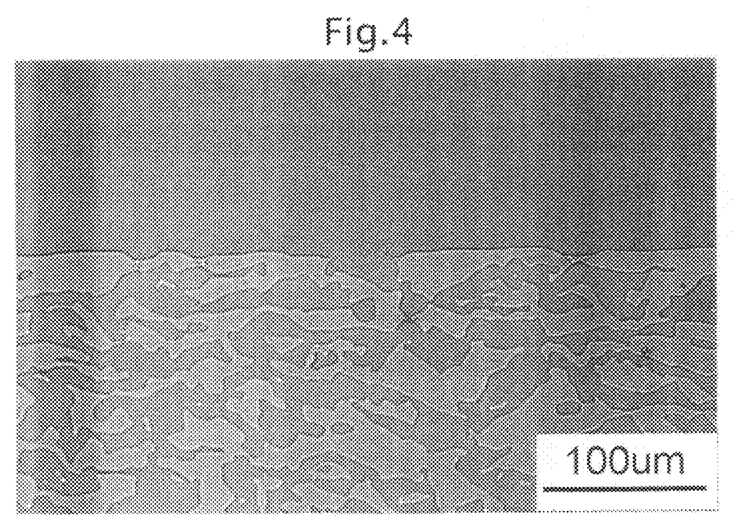
FIG. 4 is a cross-sectional view showing the bonding state of the substrate according to the present invention obtained in Example 1.

Subsequently, the plate of ceramic composite for light conversion was disposed on the lower side, the $Al_2O_3$ single crystal plate was placed thereon, and the obtained sample was set in an electric furnace. At this time, mirror faces of the $Al_2O_3$ single crystal plate and the plate of ceramic composite for light conversion were arranged to face each other. This sample was kept at 1,700° C. for 20 hours in air, thereby bonding and stacking the plates. FIG. 4 is a cross-sectional view showing the bonded state after bonding. The upper side is the $Al_2O_3$ single crystal substrate and the lower side is the ceramic composite substrate. It is seen that these substrates are closely contacted. Particularly, in the $Al_2O_3$ portion, the substrates are very successfully bonded because these are the same crystal phase.

On the $Al_2O_3$ single crystal layer (0001) face of the substrate produced by bonding, a nitride-based compound semiconductor film was formed by the MOCVD method of flowing a TMG (trimethylgallium) gas, a TMA (trimethylaluminum) gas, a nitrogen gas and a dopant gas together with a carrier gas to obtain a blue light-emitting layer. An n-type nitride-based compound semiconductor and a p-type nitride-based compound semiconductor were formed by switching the dopant gas between $SiH_4$ and $Cp_2Mg$, whereby pn-junction was formed. More specifically, an n-type GaN:Si contact layer on which an n-electrode is formed, an n-type $Al_{0.5}Ga_{0.9}N$:Si layer, an n-type $In_{0.05}Ga_{0.95}N$:Si layer, an InGaN layer which forms a single quantum well structure-type light-emitting layer, a p-type $Al_{0.1}Ga_{0.9}N$:Mg barrier layer, and a p-type GaN:Mg layer on which a p-electrode is formed, were formed on the $Al_2O_3$ single crystal layer through a GaN buffer layer. After forming each of p- and n-electrodes by sputtering, the substrate was divided by drawing a scribe line and applying external force, whereby a light-emitting diode was obtained.

Figure 5:
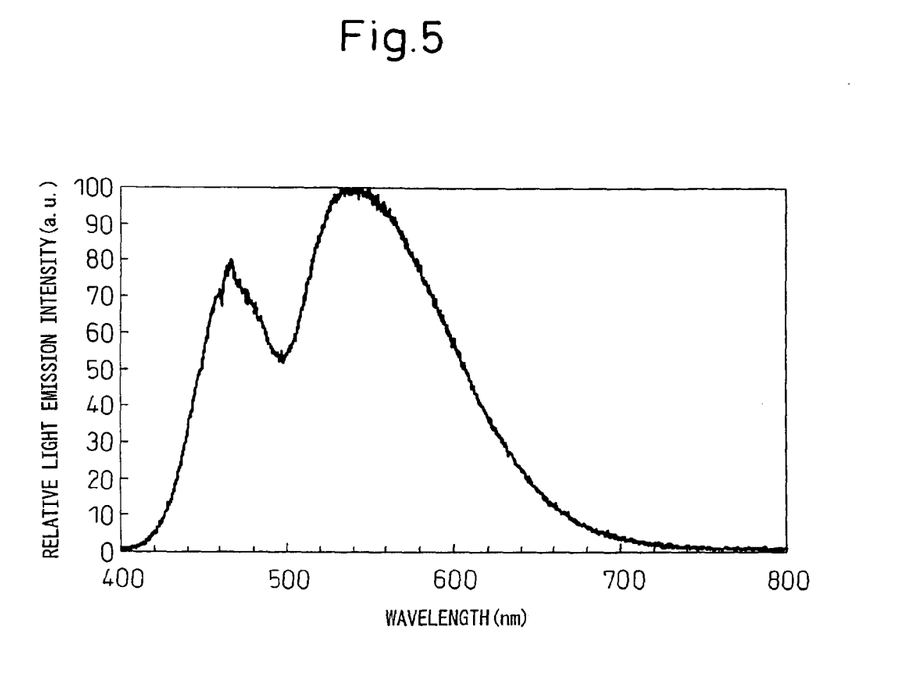
FIG. 5 is a light emission spectrum graph of the light-emitting diode obtained in Example 1.

FIG. 5 shows the light emission spectrum of the obtained light-emitting diode. Blue light from the nitride semiconductor layer and yellow fluorescence from the ceramic composite layer excited by the blue light were observed. The lights emitted from this substrate were further uniformly mixed in the substrate, and good white light was obtained.

Example 2

Figure 6:
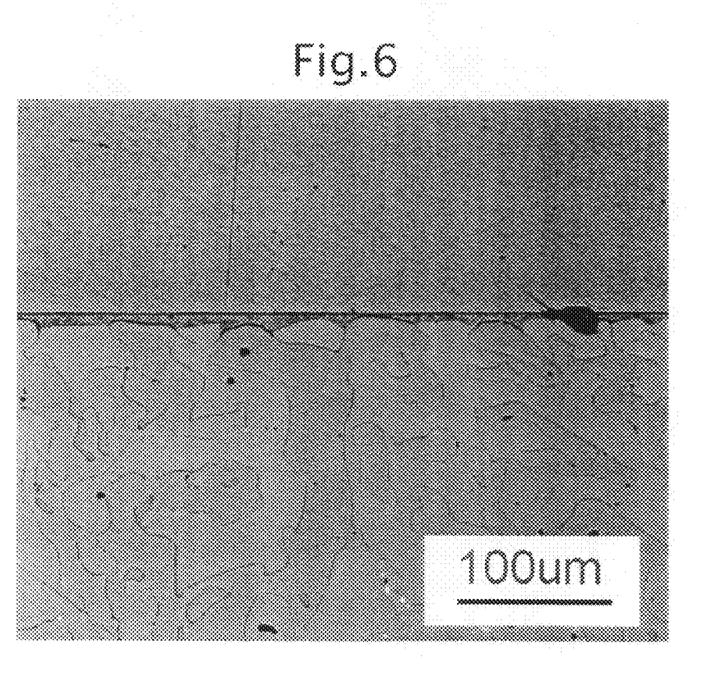
FIG. 6 is a cross-sectional view showing the bonding layer of the substrate according to the present invention obtained in Example 2.

A solution containing 30% of spherical amorphous silica having a diameter of 10 to 20 nm was coated by a spin coater on the plate of 10 mm×10 mm of ceramic composite for light conversion produced in Example 1. After the coating, this substrate was heated at 60° C. to remove the solvent component. Thereafter, the same $Al_2O_3$ single crystal plate as that of Example 1 was placed on the amorphous silica-coated surface of this plate of ceramic composite for light conversion, and the obtained sample was set in a hot-press device, heated at 1,300° C. while applying a pressure of 0.03 MPa, kept for 2 hours and then gradually cooled. FIG. 6 shows the substrate obtained. The upper side is the $Al_2O_3$ single crystal plate and the lower side is the plate of ceramic composite for light conversion. A silica phase which is an adhesion phase is present at the interface.

When a light-emitting diode was produced in the same manner as in Example 1 by using the above-produced substrate for light-emitting diodes, similarly to the substrate obtained in Example 1, blue light from the nitride semiconductor layer and yellow fluorescence from the ceramic composite layer excited by the blue light were observed. The lights emitted from this substrate were further uniformly mixed in the substrate, and good white light was obtained.

Example 3

An epoxy resin and a $CaAlSiN_3$ powder as a red fluorescent substance were weighed at a weight ratio of 1:1 and mixed in a paint shaker for 30 minutes to obtain a mixed slurry. This slurry was placed in a vacuum desiccator to remove bubbles, and the resulting paste was coated on the plate of ceramic composite for light conversion produced in Example 1. Furthermore, a sapphire substrate having formed thereon a blue light-emitting element produced by the same method as in Example 1 was laminated with the ceramic composite for light conversion. This material was placed in a constant-temperature bath at 150° C. and the resin was cured. The obtained substrate was divided by drawing a scribe line and applying external force, whereby a light-emitting diode device was obtained.

Figure 7:
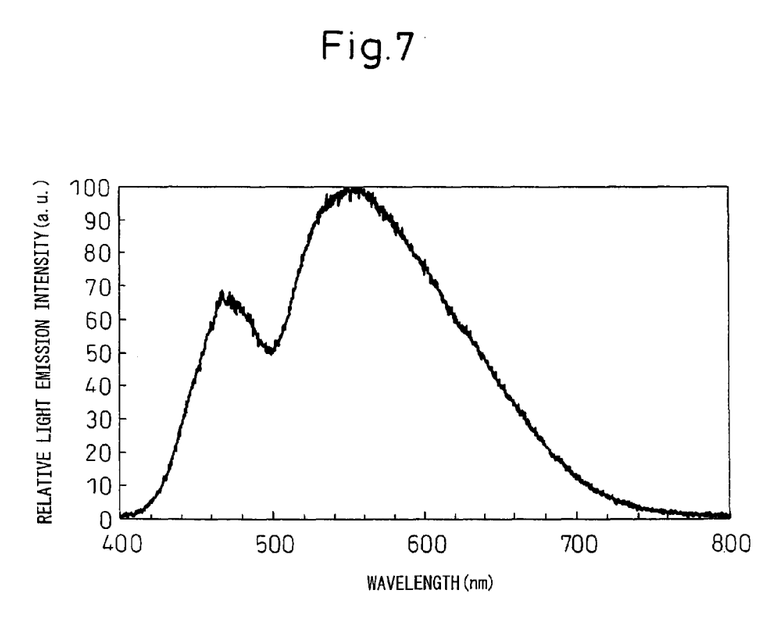
FIG. 7 is a light emission spectrum graph of the light-emitting diode obtained in Example 3.

FIG. 7 shows the light emission spectrum of the device obtained. Emission of blue light, emission of yellow fluorescence from the substrate and emission of red light from the red fluorescent substance were added, and a light emission spectrum intensified in the emission of light at 650 nm was obtained. This light had a warm white color, revealing that the color tone can be controlled.

INDUSTRIAL APPLICABILITY

According to the present invention, a substrate for light-emitting diodes, which uses no fluorescent powder, enables to form a good light-emitting diode element, less causes deterioration, transmits light of the light-emitting diode element, emits light by utilizing a part of the transmitted light, and allows the transmitted light and newly emitted light to be mixed and emitted, and a light-emitting diode using the substrate for light-emitting diodes, are provided, and therefore, the present invention is useful in industry.

The invention claimed is:

1. A substrate for light-emitting diodes, obtained by stacking a single crystal layer to form a light-emitting diode element onto a ceramic composite layer for light conversion, said ceramic composite layer having been formed by a unidirectional solidification method so that said ceramic composite layer comprises a solidified body having formed therein at least two or more oxide phases selected from single metal oxides and complex metal oxides to be continuously and three-dimensionally entangled with each other, with each oxide phase having a single crystal orientation, wherein at least one oxide phase out of the oxide phases in said solidified body contains a metal element oxide capable of emitting fluorescence.

2. The substrate for light-emitting diodes as claimed in claim 1, wherein said single crystal layer comprises a material selected from the group consisting of $Al_2O_3$, SiC, ZnO and GaN.

3. The substrate for light-emitting diodes as claimed in claim 2, wherein said single crystal layer and said ceramic composite layer for light conversion are directly bonded.

4. The substrate for light-emitting diodes as claimed in claim 2, wherein said single crystal layer and said ceramic composite layer for light conversion are bonded through a bonding layer comprising a substance capable of bonding said two layers.

5. The substrate for light-emitting diodes as claimed in claim 4, wherein said bonding layer is a resin.

6. The substrate for light-emitting diodes as claimed in claim 4, wherein said bonding layer is silica.

7. The substrate for light-emitting diodes as claimed in claim 4, wherein a fluorescent substance is present in said bonding layer.

8. The substrate for light-emitting diodes as claimed in claim 1, wherein said single crystal layer and said ceramic composite layer for light conversion are directly bonded.

9. The substrate for light-emitting diodes as claimed in claim 1, wherein said single crystal layer and said ceramic composite layer for light conversion are bonded through a bonding layer comprising a substance capable of bonding said two layers.

10. The substrate for light-emitting diodes as claimed in claim 9, wherein said bonding layer is a resin.

11. The substrate for light-emitting diodes as claimed in claim 10, wherein a fluorescent substance is present in said bonding layer.

12. The substrate for light-emitting diodes as claimed in claim 9, wherein said bonding layer is silica.

13. The substrate for light-emitting diodes as claimed in claim 12, wherein a fluorescent substance is present in said bonding layer.

14. The substrate for light-emitting diodes as claimed in claim 9, wherein a fluorescent substance is present in said bonding layer.

15. The substrate for light-emitting diodes as claimed in claim 1, wherein said single crystal layer is $Al_2O_3$ and said ceramic composite layer for light conversion is a ceramic composite containing an $Al_2O_3$ crystal and a cerium-activated crystal containing $A_3X_5O_{12}$ in the formula, A is one or more elements selected from the group consisting of Y, Tb, Sm, Gd, La and Er, and X is one or more elements selected from Al and Ga).

16. The substrate for light-emitting diodes as claimed in claim 15, wherein said cerium-activated $A_3X_5O_{12}$-type crystal is $Y_3Al_5O_{12}$:Ce.

17. A light-emitting diode obtained by forming a light-emitting diode element on said single crystal layer of the substrate for light-emitting diodes claimed in claim 1, wherein light is taken out from the side of said substrate for light-emitting diodes.

18. The light-emitting diode as claimed in claim 17, wherein said light-emitting diode element is an InGaN-based light-emitting diode element.

19. The light-emitting diode as claimed in claim 17, wherein said light-emitting diode element comprises a plurality of layers each comprising a nitride-based compound represented by the formula: $In_xAl_yGa_{1-x-y}N$ ($0 \leq x \leq 1$, $0 \leq y \leq 1$, $0 \leq x+y \leq 1$).

* * * * *